(12) United States Patent
Buti et al.

(10) Patent No.: US 6,480,931 B1
(45) Date of Patent: Nov. 12, 2002

(54) CONTENT ADDRESSABLE STORAGE APPARATUS AND REGISTER MAPPER ARCHITECTURE

(75) Inventors: Taqi Nasser Buti, Millbrook, NY (US); Peter Juergen Klim, Austin, TX (US); Hung Qui Le, Austin, TX (US); Robert Greg McDonald, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/434,802

(22) Filed: Nov. 5, 1999

(51) Int. Cl.[7] ................................................. G06F 12/02
(52) U.S. Cl. ......................................... 711/108; 365/49
(58) Field of Search .............................. 711/108; 365/49

(56) References Cited

U.S. PATENT DOCUMENTS 5,893,137 A * 4/1999 Parks et al. .................. 711/108
6,137,707 A * 10/2000 Srinivasan et al. ...... 365/189.07
6,253,280 B1 * 6/2001 Voelkel ......................... 365/49
6,266,262 B1 * 7/2001 Washburn et al. ...... 365/189.02

* cited by examiner

Primary Examiner—Hiep T. Nguyen
(74) Attorney, Agent, or Firm—Casimer K. Salys; Bracewell & Patterson, L.L.P.

(57) ABSTRACT

A non-conventional CAM (content addressable memory) and register mapper organization and circuit implementation is provided which allows simultaneous execution of a large number of CAM searches. All compare circuits are placed outside of the CAM in separate match arrays where the actual comparisons occur. The CAM cell contains only latches to hold the CAM stored bit of data and a multi-port MUX to update the CAM content. The CAM bits are driven to the match arrays for match generation. The structure of the CAM and search engine facilitates implementation of the register mapper as a group of custom arrays. Each array is dedicated to execute a specific function. All of the arrays are aligned and each row of an array is devoted to one register to keep current state, shadow state and controls for that register. In an exemplary embodiment, eight custom arrays are used to execute various functions of the register mapper.

35 Claims, 3 Drawing Sheets

CONTENT ADDRESSABLE STORAGE APPARATUS AND REGISTER MAPPER ARCHITECTURE

FIELD OF THE INVENTION

The present invention relates generally to information processing systems and more particularly to a methodology and implementation for a high speed content addressable memory and register mapper organization.

BACKGROUND OF THE INVENTION

In current computer systems, register mappers are implemented in high-performance "out-of-order" machines to manage a large set of physical registers within an associated register file. New registers are allocated during instruction dispatch for each instruction that writes a new result. The mapper maintains a register map to locate the physical registers that hold the latest or most current results for each logical register. A CAM (content-addressable memory) structure capable of simultaneously performing multi-searches is required to establish such a register map.

Using a conventional approach, a basic single-compare CAM cell such as the CAM cell illustrated in FIG. 1, can store, read and write a one-bit datum. The single-compare CAM cell can also compare a single incoming bit of data (DATA) against the stored content of the cell (STR) and indicate whether or not there is a match (MATCH). The CAM array consists of a fixed number of word-row's. And each word-row (CAM word) has the same number of CAM bits (one CAM entry). The CAM array is supported by word-row and bit_column logic to update and access the CAM content. The match operation generates a match line (MATCH) if all the bits in the search pattern match all the bits in one CAM entry. The bit-wise compares ("Match" in FIG. 1) in one CAM entry are AND'ed together to produce a match. The output match line is usually used to enable encoding and other readout circuits. Notice that only a single CAM search can be performed at a time with this circuit topology.

In register mapping applications, the number of word-rows is set equal to the number of physical registers available in the register pool. The CAM bit patterns in a word-row are the binary representation of the logical registers used in the instruction sets. The mapping implemented in the CAM array defines the associations of theological registers with the actual physical registers. This association can also be dynamically updated during instruction dispatch. The output match line is encoded to broadcast the matched physical register. Such circuits are placed outside and nearby the CAM array.

The CAM cell in FIG. 1 is capable to perform one single search (compare) at a time. For high performance processor, numerous (for example, more than eight) different searches (compares) are required to be made simultaneously against each CAM entry in a single clock cycle. A CAM structure with multi-compare CAM cells is required to accommodate such large number of searches. In this case multi-match lines are needed for each CAM entry. One match line for each search per CAM entry. All these match lines must be driven by the same CAM entry. To obtain this, one must integrate into the CAM cell structure as many bit-wise compare circuits as the CAM searches to be conducted in one clock cycle.

Theoretically, this can be accomplished by simply integrating the required number of compare circuits (similar to the one in FIG. 1) into the CAM cell topology shown in FIG. 1. Each compare has its own data/data_bar lines, but all compare circuits are connected to the same cell storage nodes (str/str_bar in FIG. 1). However, the overhead of running this many tens of bit-wise compares and match lines across each CAM entry would make the CAM cell and CAM entry area far too large to be used in practical chip design.

If the bit-wise compare circuits are added to form a vertical stack, this would increase the height of the CAM cell by more than one order of magnitude. It would be impossible to accommodate such CAM size in a chip design. On the other hand, the required compare circuits can be integrated into the CAM cell to form a horizontal stack of bit-wise compare lines. In this case many tens of compare lines must run across the CAM entry to produce the match lines corresponding to the various search vectors presented to the CAM array. The number of horizontal wires across the entry would limit the minimum size of the CAM cell that can be achieved with this approach. The wire loadings on the compare nodes will be excessive and the device sizes should be increased to compensate for that. The CAM cell storage nodes would see increased loads as well due to the increased number of compares. This degrades the speed of cell's search and update. The cross-coupled inverters in FIG. 1 would also have to be made larger.

The overall size of the CAM entry is determined by the total size of match line generation circuits. For a given search vector, the corresponding bit-wise compare lines are extended across the CAM entry and combined (AND'ed) to obtain the output match lines. The match lines are then driven outside the CAM array to enable encoder and readout circuits. These circuits would present substantial wiring and device loads that require large match line drivers. This would ultimately increase the CAM entry area also.

All of the above indicate potential integration problems using conventional approaches because exceedingly large number of horizontal wires running across the CAM array would be required and the overall size of the CAM entry would be increased considerably and is clearly a poor utilization of the chip area.

Thus there is a need for an improved and practical methodology and implementation which provides an optimal approach for CAM and Mapper organization and circuit topologies.

SUMMARY OF THE INVENTION

A non-conventional methodology is provided for designing area efficient CAM (content addressable memory) circuit topology and for organizing a register mapper that uses the CAM array thereby allowing a large number of CAM searches to occur simultaneously. In an exemplary implementation, all compare circuits are placed outside of the CAM in separate match arrays where the actual comparisons occur. The CAM cell contains only latches to hold the CAM stored bit of data and a multi-port MUX to update the CAM content. The bit-wise compare functions of the CAM cells are physically separated from the CAM entry and placed in a "match entry" that is horizontally aligned with the CAM's storage entry. The bits in the CAM storage entry are driven horizontally to all match arrays, and compared simultaneously against all search vectors presented to the various match arrays. The match lines encoder and read-out circuitry are both integrated locally within each match array which minimizes the total load on the match lines and reduces the overall width and area of the match array thereby substantially increasing the speed of the entire match generation and encoding. The structure of the CAM and search engine facilitates the implementation of the register mapper as a group of custom arrays, with each array being dedicated to execute a specific function. All of the arrays are aligned and each row of an array is devoted to one register to keep current state, shadow state and controls for that register. In the exemplary embodiment, eight custom arrays are used to execute various functions of the register mapper. The eight arrays in the example include a CAM storage array, a source match array, a ready bits array, an architected bit array, a destination match array, an allocation array, a free list array and a shadow map array.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION

The various methods discussed herein may be implemented within a high performance out-of-order computer system, which may include a workstation or personal computer, and may also be included within a larger system which may further include a plurality of processors in a multi-bus system in a network of similar systems. However, since the workstation or computer system implementing the present invention in an exemplary embodiment, is generally known in the art and composed of electronic components and circuits which are also generally known to those skilled in the art, circuit details beyond those shown are not specified to any greater extent than that considered necessary as illustrated, for the understanding and appreciation of the underlying concepts of the present invention and in order not to obfuscate or distract from the teachings of the present invention.

Figure 1:
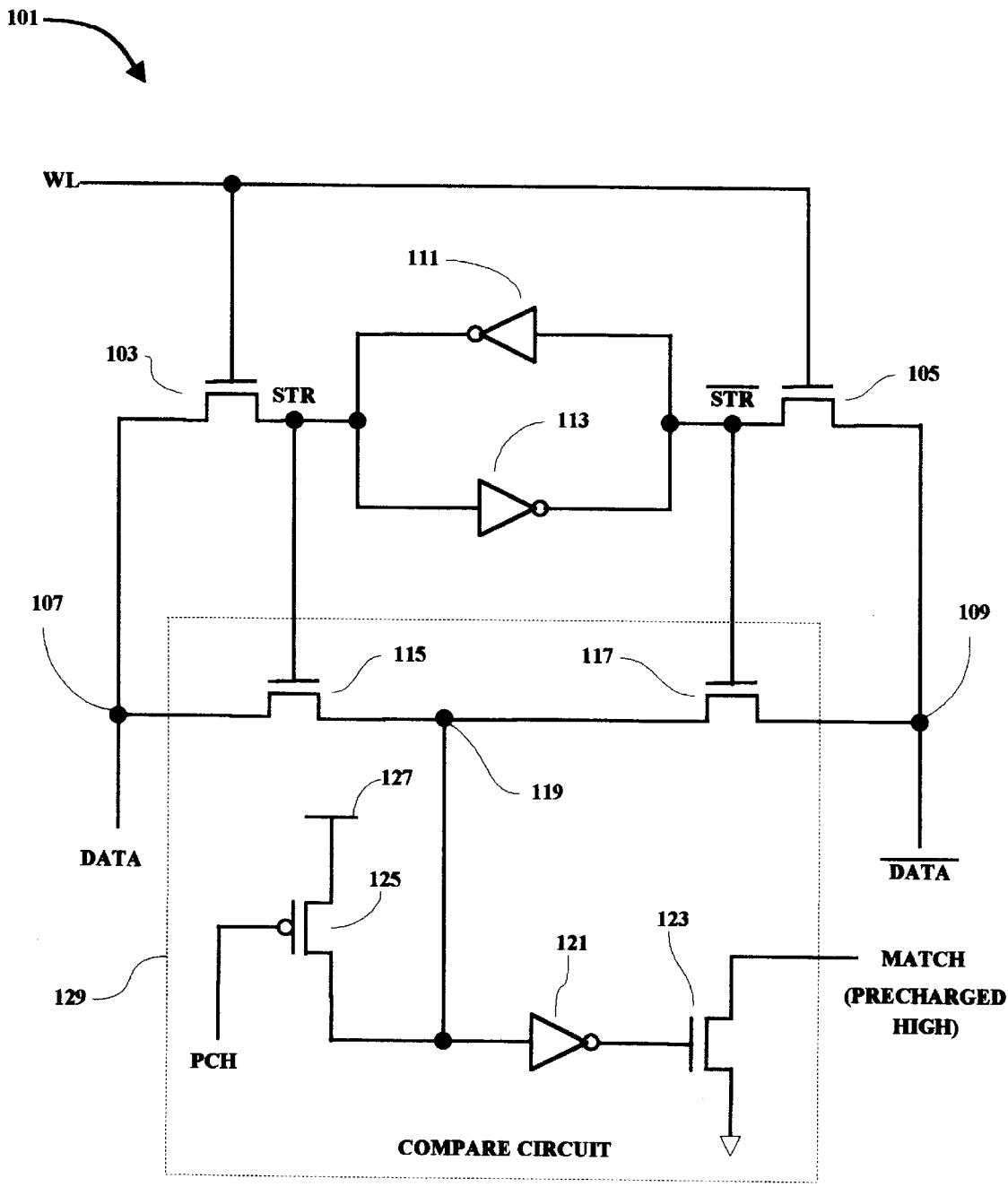
FIG. 1 is an exemplary prior art single-compare CAM cell.

In FIG. 1, there is illustrated a prior art single-compare CAM storage cell 101. A WL line is connected to corresponding gate terminals of a pair of transistors 103 and 105. Transistor 103 is connected between a DATA terminal 107 and a STR node. Transistor 105 is similarly connected between a DATA_node 109 and a STR_node. The STR node is connected to an output terminal of an inverter 111 and also to an input terminal of an inverter 113. Similarly, the STR_node is connected to the input of inverter 111 and also to the output of inverter 113. The two inverters 111 and 113 are connected in a cross-coupled manner. The STR and STR_nodes are also connected to a second pair of transistors 115 and 117, respectively, which are, in turn, serially connected between node 107 and node 109. A common node between the transistors 115 and 117 is connected to an input terminal of an inverter 121, the output of which is connected to the gate terminal of a MATCH output transistor 123. A PCH signal is applied to a gate terminal of transistor 125, which is connected between a supply potential 127 and the input to inverter 121. The transistor 123 provides a MATCH output signal relative to a reference or ground potential. The MATCH signal is representative of whether there is a match between an input DATA signal and a stored STR signal on a single cell basis as hereinbefore described.

The present invention discloses a non-conventional approach for designing area efficient CAM circuit topology and for organizing the register mapper that uses the CAM array. This design offers a CAM structure optimal for giga-hertz processor register mapping application. It allows one to execute simultaneously a fairly large number (8 to 12) of CAM searches. During instruction dispatch in out-of-order machines, 8 to 12 logical register binary tags are searched in the same clock cycle against the CAM contents. The matched CAM entries point to the physical registers that are assigned to the logical registers presented to the mapper's CAM map.

In accordance with the present invention, instead of integrating the bit compare function into the CAM circuit topology, as is the case with the conventional approaches discussed above, the compare is done outside the CAM entry. The CAM content storage/update portion of the CAM cell is separated from the compare component. The CAM cell contains only latches to hold the CAM stored bit of data and a multi-port MUX to update the CAM's content. A CAM's "storage entry" is then a row of these storage cells. The CAM storage array consists of all rows of storage entries. In the exemplary mapper application, the bits of one logical register tag are stored in one storage entry of the CAM array. The bit-wise compare functions of the CAM cells and the match line logic are physically separated from the CAM entry and placed in a "match entry" that is horizontally aligned with the CAM's storage entry. The array of match entries has the same number of rows as the CAM storage array. Each search vector has its own match array. There are as many match arrays as the searches to be made against the CAM stored data. The bits in a CAM storage entry are driven horizontally on long buses to all match arrays. There they are compared simultaneously against all search vectors presented to the various match arrays. Each search vector is transmitted to a separate match array and driven vertically on long buses across the array entries. For a given match array, a match is obtained when all the bits of the transmitted search vector match the corresponding bits of one CAM storage entry which are driven to and available at the entry location of the match array. The match entry contains bit-wise compare circuits (XNOR's) and a gate to AND these compares to generate a CAM match for the presented search vector.

Figure 2:
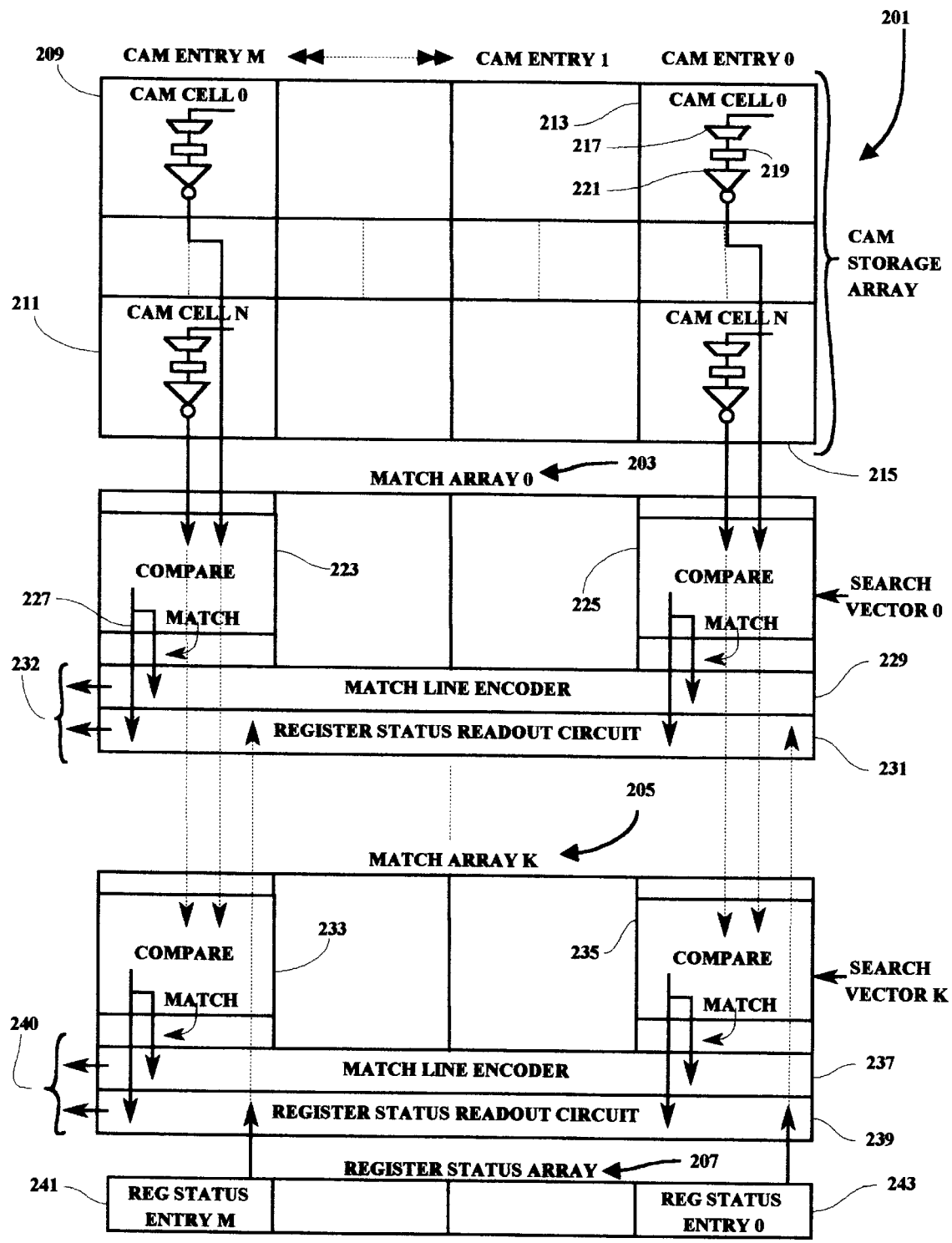
FIG. 2 is a register mapper organization showing CAM storage array, match arrays and register status arrays for an exemplary embodiment of the present invention.

Each match array in the example also contains an encoder to encode the matched physical register. The encoded physical register tag can then be transmitted to enable different circuits down the pipeline. The array also contains wide MUXs to enable the readout of various register status data. These status data are stored in separate arrays and are driven to the match arrays on long buses similar to driving the CAM storage data. As shown in FIG. 2, the match lines are used local to the match array to drive these encoder and readout circuits. This minimizes the load on the match lines and improves the speed as well as the required area.

The height of the CAM array is reduced by large amount compared to conventional CAM. The structure of the CAM entry is largely simplified by removing all the compare circuits outside the CAM array. This alone could amount to an order of magnitude reduction in the height of the CAM cell/entry in reference to conventional CAM configurations. The actual comparisons of bit patterns occur outside the CAM array and in the match arrays. The drivers of the CAM bits to the match arrays are sized to optimize the drive delay while keeping the CAM entry dimensions to minimum values. The height of the CAM array sets up the heights of all the remaining arrays included in the mapper and therefore the height of the entire mapper block.

The match lines for a given search vector (a logical register binary tag in mapper applications) are generated in a separate dedicated array "a match array". All the match arrays receive the same CAM bit patterns (one pattern per entry) but are presented with different search bit patterns. One search vector runs vertically across the entire match array to generate a match line at each entry. The match lines encoder and the readout circuitry are both integrated locally within each match array and are distributed across the entire depth of the array. This minimizes the total load on the match lines and reduces the sizes of the match line drivers which in turn brings down the bit-wise compare XNOR sizes and the overall width and area of the match array. It also increases the speed of the entire match generation and encoding by a considerable amount. In contrast, the conventional CAM and mapper configuration presents very large loads on the match lines and incurs substantial area and speed penalties. The disclosed configuration provides a compact and area-efficient CAM and mapper floor plan.

The structure of the exemplary CAM and search (compare) engine is illustrated in FIG. 2. As shown in FIG. 2, a CAM storage array 201 in the exemplary embodiment includes an array of storage cells such as storage cells 209, 211, 213 and 215. The CAM storage array 201, which in the illustration is "M" CAM entries high and "N" CAM cells wide, contains the CAM register map. Only CAM storage update MUXS, e.g. 217, latches, e.g. 219, and CAM data drivers, e.g. 221, are kept in the CAM storage array 201. The CAM data are driven to source and destination arrays (FIG. 3) where the actual comparisons occur. Thus, unlike the prior art, the CAM compare function is separate from the storage cells in the exemplary embodiment.

A match array, including Match Array "0" (203) to Match Array "K" (205), contains compare/match logic for looking up (8 to 12) logical registers in the mapper. Each of the 8 to 12 logical registers is compared to the contents of the CAM and a match line (MATCH) is produced for each entry (register) in the mapper. These match lines are encoded 229, 237 in their corresponding match array 203, 205, respectively, to provide the register tags, and are also used to enable the readout 231, 239 of register status bits 243, 241 (the so-called "ready bits") of the register status array 207. The encoded physical register tags and register status output data 232 and 240 are transmitted outside the mapper to enable different circuits down the pipeline.

Figure 3:
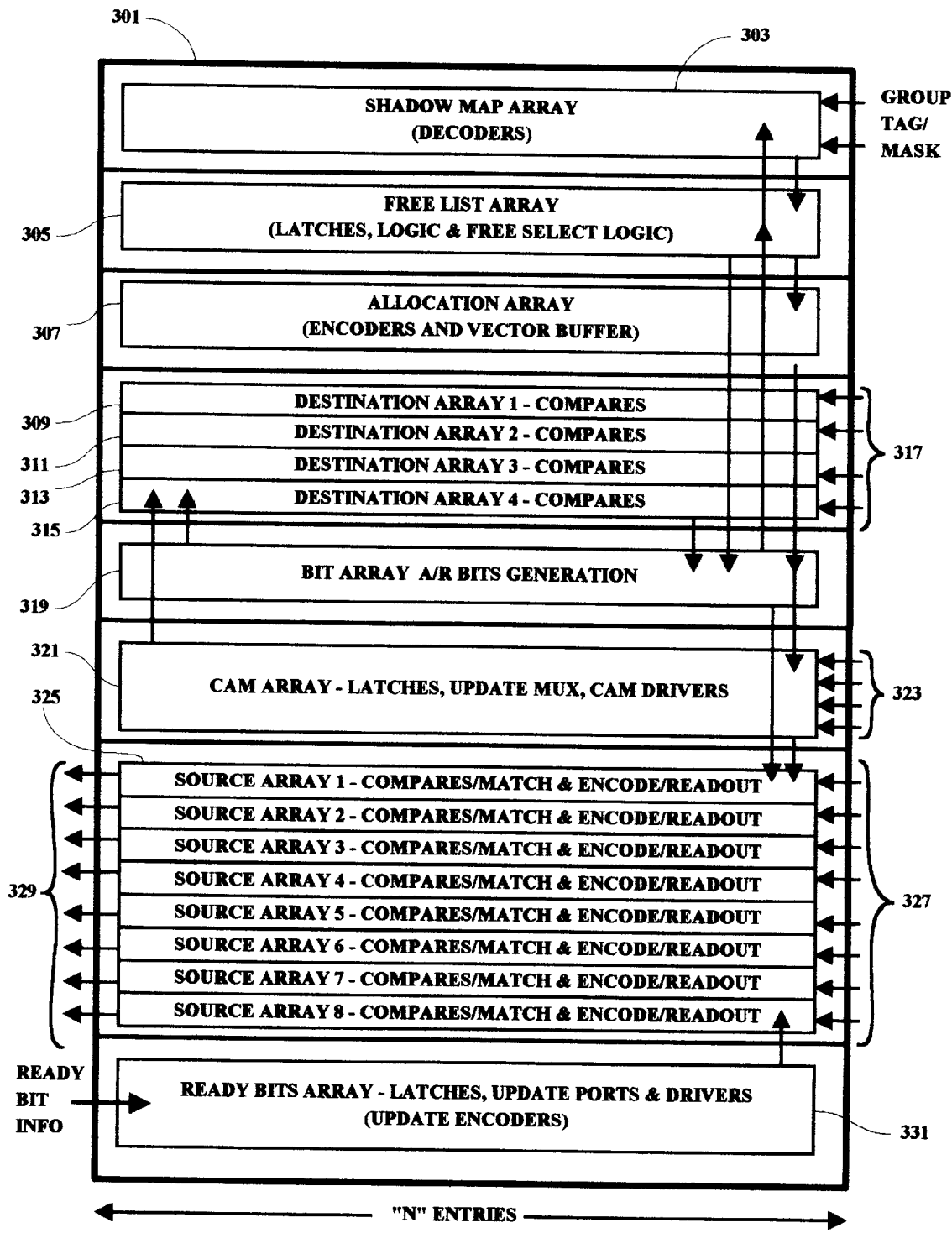
FIG. 3 is an illustration of an entire mapper organization in accordance with the present invention.

The disclosed CAM structure facilitates the implementation of the register mapper as a group of custom arrays 301 as shown in FIG. 3. Each array is dedicated to execute a specific function. The rows of all arrays are aligned together. Each row of the array is devoted to one register to keep current state, shadow state and controls for that specific register. The entire mapper is sliced into eight special custom arrays to execute the various functions of the register mapper as shown in FIG. 3.

The CAM storage array 321 as shown in FIG. 3, contains the CAM register map. Only CAM storage latches, update MUX and CAM data drivers are kept in this array. The CAM data are driven to source and destination arrays where the actual comparisons occur. The destination logical register tags 323 are used to update the CAM content.

A source match array 325 contains compare/match logic for looking up between eight and twelve (eight in the example) logical source registers 327 in the mapper. Each of the logical source registers 327 (logical source search vectors) are compared to the contents of the CAM and a match line is produced for each entry (register) in the mapper. These match lines are encoded in their corresponding match array to provide the register tags and are also used to enable the readout of register status bits or "ready bits". In FIG. 3, only 8 source arrays 325 are shown for the sake of clarity. The outputs 329 of the source array 325 are driven outside the mapper to enable circuits down the pipeline. The word "source" refers to the source logical register of a given instruction and "destination" refers to the destination logical register of that instruction. For example, in the instruction R3=R1+R2, R1 and R2 are source logical registers and R3 is a destination logical register.

A Ready Bits Array 331 has the latches to hold the ready bit register status information (w, dl0 & dl1). The "w", "dl0" and "dl1" are special register status bits to indicate whether the register's data is available (possibly conditioned upon the outcome of a load instruction). These latches require some special shifting and resting functions. The ready bit data are driven to the source array and available to be read out for each source (see FIG. 2 also). Update decoders are also required to control update of these bits as register values become available. When a register is allocated, its w and dl bits are cleared. When a register value becomes available, the w bit is set to 1 and the dl bits are set using information from the instruction issue queue logic. Otherwise, the dl bits shift logically each cycle.

A BIT array 319 (Architected bit array) holds bits to indicate an "architected" state (A bit) and a "replaced" state (R bit) of the physical registers. It also contains logic to generate these two bits during instruction dispatch. These bits are used to update the A bits and are also sent to the free list array 305 and shadow array 303 during subsequent cycles. After flush, this logic also assists in restoring A bits from the shadow maps 303.

A Destination array 309, 311, 313 and 315 (destination match array) contains logic for looking up four logical destination registers in the mapper. Four logical destination registers 317 (logical destination search vectors) are compared to the contents of the CAM and four match lines are produced for each entry in the mapper. These four match lines are then OR'ed together for use in generating the A and R bits.

An Allocation array 307 includes "encoded allocation buffers" to keep encoded register tags that must be sent to local and remote instruction issue queues during dispatch. The Allocation array 307 is also used to indicate register availability and generate a resource hold signal for the mapper when necessary. The array 307 also includes "vectored allocation buffers" to keep the same register identifiers in a vectored format to control register allocation within the mapper during dispatch.

A Free list array 305 holds bits and uses logic to generate and select a set of free registers to be used during subsequent instruction dispatch.

A Shadow Map array 303 contains the shadow maps that are saved for each group of dispatched instructions. Two bits "A" and "R" are saved for each group of instructions and for each register in the mapper. Bits are written during the cycle after dispatch from latches stored in the architected bit array. Bits are read during the cycle after instruction completion/flush is received.

The method and apparatus of the present invention has been described in connection with a preferred embodiment as disclosed herein. The disclosed methodology may be implemented in a wide range of sequences, menus and screen designs to accomplish the desired results as herein illustrated. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method for arranging an integrated circuit topology for a content addressable memory (CAM) that allows simultaneous execution of multiple CAM searches, said CAM including a plurality of CAM cells including first and second CAM cells, each of said CAM cells further including a storage portion and a corresponding compare portion, said method comprising:

arranging said storage portion of each of said plurality of CAM cells in a first array, wherein the storage portions within the first array are arranged in a plurality of multi-bit entries;

arranging said corresponding compare portion of each of said plurality of CAM cells in a second array separate from said first array such that a storage portion of the first CAM cell is disposed between a storage portion of said second CAM cell and a compare portion of the second CAM cell; and coupling each storage portion within the first array to the corresponding compare portion within the second array by a respective one of a plurality of bit buses such that, responsive to receipt of a search vector at said second array, the compare portions of said plurality of CAM cells concurrently compare all bits of all of the plurality of multi-bit entries with corresponding bits of said search vector.

2. The method as set forth in claim 1, and further comprising forming within said first array an update portion for each of said plurality of CAM cells.

3. The method as set forth in claim 1, wherein arranging said storage portion includes arranging multiple storage cells in each of a plurality of rows, wherein each row of storage cells stores a respective CAM data entry.

4. The method as set forth in claim 3, and further comprising forming match portions physically separate from said first array and coupled to said compare portions within said second array.

5. The method as set forth in claim 4, wherein forming match portions comprises providing a separate match array for each search vector that may concurrently be applied to said CAM.

6. The method as set forth in claim 5, wherein said coupling comprises coupling each row of storage cells to all of said match arrays utilizing parallel data buses.

7. The method as set forth in claim 6, and further comprising concurrently comparing all of said CAM data entries against all search vectors presented to said match arrays.

8. The method as set forth in claim 6, and further comprising forming search vector buses across each match array perpendicular to said parallel data buses.

9. The method as set forth in claim 5, and further comprising forming within each match array an encoder to encode an indication of which row of said storage array stores a CAM data entry matching a search vector.

10. The method as set forth in claim 9, and further comprising providing within each match array a readout circuit to enable readout of selected register availability status data in conjunction with said indication.

11. A register mapper configuration comprising:

a group of function arrays, each of said function arrays being dedicated to execute corresponding specific functions of said register mapper, said function arrays including:

a storage array and a separate compare array for effecting storage of data and comparisons of said stored data with a plurality of input search vectors, respectively, wherein said storage array is arranged as a plurality of multi-bit entries containing a plurality of bit storage cells, said plurality of bit storage cells including at least first and second bit storage cells, and wherein said first bit storage cell is disposed between said second bit storage cell and said compare array; and a plurality of bit buses each coupling a respective one of the plurality of bit storage cells in the storage array to the compare array, such that the compare array can concurrently compare all bits within the plurality of multi-bit entries with corresponding bits of said plurality of search vectors.

12. The register mapper configuration of claim 11, wherein said compare array comprises a plurality of separate match arrays that indicate if a match exists between said stored data and a respective one of said plurality of search vectors.

13. The register mapper configuration of claim 12 and further including a separate ready bit array, said ready bit array being effective for holding information related to register availability for use.

14. The register mapper configuration of claim 13 and further including a separate architected bit array, said architected bit array being effective for holding information related to architected and replaced states of physical registers.

15. The register mapper configuration of claim 14 and further including a separate destination match array, said destination match array being used to generate said architected and replaced states of physical registers.

16. The register mapper configuration of claim 15 and further including a separate allocation array, said allocation array being effective for holding information related to control register allocation within said register mapper.

17. The register mapper configuration of claim 16 and further including a separate free list array, said free list array being effective for holding information related to a selection of sets of free registers to be used during instruction dispatch.

18. The register mapper configuration of claim 17 and further including a separate shadow map array, said shadow map array being effective for holding information related to saved shadow maps which are saved for each group of dispatched instructions.

19. The register mapper configuration as set forth in claim 11 wherein each function array within the group of function arrays has a height no greater than a height of the storage array.

20. An integrated circuit, comprising:

a substrate; and a content addressable memory (CAM) formed on said substrate, said CAM including:

a plurality of CAM cells including first and second CAM cells, each of said CAM cells further including a storage portion and a compare portion, wherein:

said storage portion of each of said plurality of CAM cells is arranged in a first array, wherein the storage portions within the first array are organized in a plurality of multi-bit entries;

said compare portion of each of said plurality of CAM cells is arranged a second array separate from said first array, such that a storage portion of the first CAM cell is disposed between a storage portion of said second CAM cell and a compare portion of the second CAM cell; and a plurality of bit buses each coupling a respective storage portion in the first array to a corresponding compare portion in the second array, such that the second array can concurrently compare all bits within the plurality of multi-bit entries of the first array with corresponding bits of a search vector.

21. The integrated circuit of claim 20, wherein said integrated circuit comprises a processor including a plurality of registers, instruction processing circuitry coupled to the plurality of registers, and a register mapper including said CAM coupled to the instruction processing circuitry.

22. A content addressable storage apparatus, comprising:

a storage cell array including multiple storage cell entries that each include a plurality of storage cells that each store a single data bit, wherein said plurality of storage cells includes first and second storage cells;

a plurality of match arrays physically separate from the storage cell array, wherein:

each of said plurality of match arrays includes multiple compare cells that are each coupled to the plurality of storage cells within a respective one of said multiple storage cell entries;

each compare cell includes compare circuitry that performs bit-wise comparison of bits from a search vector with data bits received from the plurality of storage cells within the associated storage cell entry; and said first storage cell is disposed between said second storage cell and said plurality of match arrays; and a plurality of bit buses each coupling a respective one of the plurality of storage cells in the storage cell array to a compare cell within each match array, such that the match arrays can concurrently compare all bits within each storage cell entry in the storage cell array with corresponding bits of a respective search vector.

23. The content addressable storage apparatus of claim 22, wherein each of said plurality of storage cells is coupled to a single one of the plurality of bit buses to convey the single data bit stored by that storage cell.

24. The content addressable storage apparatus of claim 22, and wherein compare cells from different ones of said plurality of match arrays that are associated with a same storage cell entry are horizontally aligned.

25. The content addressable storage apparatus of claim 22, wherein each of said plurality of compare cells includes respective match circuitry that receives inputs from said compare circuitry and signals a match only if said bit-wise comparison indicates that all search vector bits match all data bits from the associated storage cell entry.

26. The content addressable storage apparatus of claim 25, and further comprising a plurality of match encoders, wherein each of said plurality of match encoders is integrated in proximity to and coupled to a respective one of said plurality of match arrays, and wherein a match encoder, responsive to detecting a match between a search vector and data bits stored by a particular storage cell entry, encodes and outputs an indication identifying said particular storage cell entry.

27. The content addressable storage apparatus of claim 22, and further comprising:

a status array containing a plurality of status entries that are each associated with a respective one of said plurality of storage cell entries, wherein each of said status entries stores a status for the associated storage cell entries; and a plurality of status readout circuits that are each associated with and coupled to a respective one of said plurality of match arrays, wherein each status readout circuit is further coupled to said status array, wherein a status readout circuit, responsive to receipt of indication of a match between said search vector and data within a storage cell entry, outputs a status for the storage cell entry containing data bits matching the search vector.

28. The content addressable storage apparatus of claim 22, and wherein the content addressable storage apparatus comprises a register mapper apparatus, and wherein the plurality of storage cells within each storage cell entry stores data bits identify a relationship between a logical register and a physical register within a register file.

29. The content addressable storage apparatus of claim 28, and further comprising:

a register availability status array containing a plurality of status entries that are each associated with a respective one of said plurality of storage cell entries, wherein each of said status entries stores a register availability status for the associated storage cell entries; and a plurality of status readout circuits that are each associated with and coupled to a respective one of said plurality of match arrays, wherein each status readout circuit is further coupled to said status array, wherein a status readout circuit, responsive to receipt of indication of a match between said search vector and data within a storage cell entry, outputs a register availability status for the storage cell entry containing data bits matching the search vector.

30. The content addressable storage apparatus of claim 22, wherein each of the plurality of storage cells comprises:

an update multiplexer having multiple inputs and a multiplexer output;

a data latch having a latch input and a latch output, wherein said latch input is coupled to said multiplexer output, wherein said data latch stores the single data bit; and a single-ended output driver coupled to the latch output, wherein said output driver outputs the single data bit.

31. The content addressable storage apparatus of claim 22, wherein each of the plurality of storage cells only includes the update multiplexer, the data latch and the single-ended output driver.

32. The content addressable storage apparatus of claim 22, wherein said plurality of bit buses are generally parallel to each other, and wherein said content addressable storage apparatus further comprises a set of search vector buses formed across each match array perpendicular to said plurality of bit buses.

33. A processor, comprising:

instruction processing circuitry;

a register set coupled to the instruction processing circuitry; and a register mapper coupled to the instruction processing circuitry, wherein the register mapper includes the content addressable storage apparatus of claim 22.

34. A register renaming mapper for managing a register file of physical registers within an out-of-order processor, said register renaming mapper comprising:

a memory array that stores data associating logical register names with physical registers within the register file;

a memory content compare and match array coupled to the memory array to receive said data from the memory array and concurrently compare said data with multiple search vectors, wherein said memory content compare and match array outputs register identifiers identifying match relationships between physical registers and logical register names specified by said search vectors;

a register allocation array coupled to the memory array that tracks allocation of the physical registers within the register file;

an architected and replaced register array storing architected state information regarding said physical registers; and means for freeing physical registers and saving copies of register states.

35. The register renaming mapper of claim 34, and further comprising a register availability status array.

* * * * *